United States Patent
Donelly et al.

(10) Patent No.: US 6,665,851 B1
(45) Date of Patent: Dec. 16, 2003

(54) QUICK PLACEMENT OF ELECTRONIC CIRCUITS USING ORTHOGONAL ONE DIMENSIONAL PLACEMENTS

(75) Inventors: Ross A. Donelly, Sunnyvale, CA (US); William C. Naylor, San Jose, CA (US)

(73) Assignee: Synopsys, Inc., Mountain View, CA (US)

(*) Notice: Subject to any disclaimer, the term of this patent is extended or adjusted under 35 U.S.C. 154(b) by 181 days.

(21) Appl. No.: 10/006,965

(22) Filed: Dec. 4, 2001

(51) Int. Cl.[7] .............................. G06F 17/50
(52) U.S. Cl. ................ 716/8; 716/9; 716/10; 716/11; 716/1
(58) Field of Search ............ 716/8, 9, 10, 11, 716/1

(56) References Cited

U.S. PATENT DOCUMENTS

| | | | | |
|---|---|---|---|---|
| 5,159,682 A | * | 10/1992 | Toyonaga et al. | 716/10 |
| 5,420,800 A | * | 5/1995 | Fukui | 716/10 |
| 5,579,237 A | * | 11/1996 | Shibuya | 716/8 |
| 5,627,999 A | * | 5/1997 | Cheng et al. | 716/8 |
| 5,638,292 A | * | 6/1997 | Ueda | 716/8 |

* cited by examiner

Primary Examiner—Vuthe Siek
Assistant Examiner—Sun James Lin
(74) Attorney, Agent, or Firm—Bever, Hoffman & Harms, LLP; Jeanette S. Harms

(57) ABSTRACT

A method and system for the quick placement of electronic circuits using orthogonal one dimensional placements. All circuits of a design may be placed in a linear dimension to obtain a first placement. Next, those same circuits may be placed in a second linear dimension, orthogonal to the first dimension, in order to obtain a second placement. Finally, a two dimensional placement for the circuits may be created by selecting for each circuit element a first coordinate from the first placement and a second coordinate from the second placement.

27 Claims, 3 Drawing Sheets

QUICK PLACEMENT OF ELECTRONIC CIRCUITS USING ORTHOGONAL ONE DIMENSIONAL PLACEMENTS

FIELD OF THE INVENTION

Embodiments of the present invention relate to the field of electronic design automation (EDA). More particularly, embodiments of the present invention relate to techniques for cell placement and other optimizations used in the design and fabrication of integrated circuit devices.

BACKGROUND ART

The rapid growth of the complexity of modern electronic circuits has forced electronic circuit designers to rely upon computer programs to assist or automate most steps of the design process. Typical circuits today contain hundreds of thousands or millions of individual pieces or "cells." Such a design is much too large for a circuit designer or even an engineering team of designers to manage effectively manually.

One of the most difficult, complex and time-consuming tasks in the design process is known as placement. The placement problem is the assignment of a collection of connected cells to positions in a 2-dimensional arena, such that objective functions such as total wire length are minimized.

Conventionally, both the X and Y coordinates of the cells are determined simultaneously. There are many well known tools commercially available to accomplish this task, for example, the "Physical Compiler" by Synopsys of Mountain View, Calif.

Unfortunately, simultaneous two-dimensional placement is computationally intensive. Generally, such placement may take a period of time proportional to N (sqrt(N)) log(N), where N is the number of cells to be placed. Even on the fastest workstations, this task can take several hours for typical designs with several hundred thousand cells, and several days for designs with more than a million cells.

Although there are points in the design process at which the designer may be willing to trade long duration run times for increasing optimizations of the implementation of the design, there are many other circumstances when such time durations are very problematic.

For example, in the beginning stages of the physical design process, a "floor plan" is typically produced. A floor plan is a general guide as to the location that circuits, or groups of circuits, may be placed in the final design. In general, it is unacceptable to devote the time required for a full placement to this stage of the process. Further, the level of detailed optimization provided by full placement is generally not required at this stage.

As a result, floor planning is typically a very manual effort, involving much effort by the designers and their understanding of the overall design.

In addition, as chip designs continue to become more complex, and as the number of designers working on a chip continues to grow, it is becoming more and more difficult for a single person to understand the design well enough to produce an effective floor plan. Further, it is very difficult for a team, especially a large team to produce an effective floor plan working cooperatively. Consequently, an automated floor planning tool would be very appealing.

In other circumstances, reducing the time required to complete a design may be more important than achieving the optimal physical implementation of a design.

In addition, some simultaneous two-dimensional placers often benefit, in terms of run time and output quality, when given an initial placement to work from as a starting point. This seems to be especially the case when working on very large (several million cells) designs.

Therefore, for these reasons and more, a faster automatic method of placing electronic circuits in two dimensions is highly desirable. Such a method would have applications in floor planning, fast path designs and for seeding two dimensional placers, and potentially other areas of electronic design.

SUMMARY OF THE INVENTION

Embodiments of the present invention enable the fast placement of cells in an integrated circuit design. Further embodiments of the present invention enable a one-dimensional placement of cells in an integrated circuit design. Still further embodiments of the present invention enable the iterative improvement of an initial one-dimensional placement of cells in an integrated circuit design.

A method and system for the quick placement of electronic circuits using orthogonal one dimensional placements is disclosed. All circuits of a design are placed in a linear dimension to obtain a first placement. Next, those same circuits are placed in a second linear dimension, orthogonal to the first dimension, in order to obtain a second placement. Finally, a two dimensional placement for the circuits is created by selecting for each circuit element a first coordinate from the first placement and a second coordinate from the second placement.

Another embodiment of the present invention provides a method of placing electronic circuits in a linear dimension.

In one embodiment of the present invention, a first one-dimensional placement is iteratively improved.

DETAILED DESCRIPTION OF THE INVENTION

Figure 1:
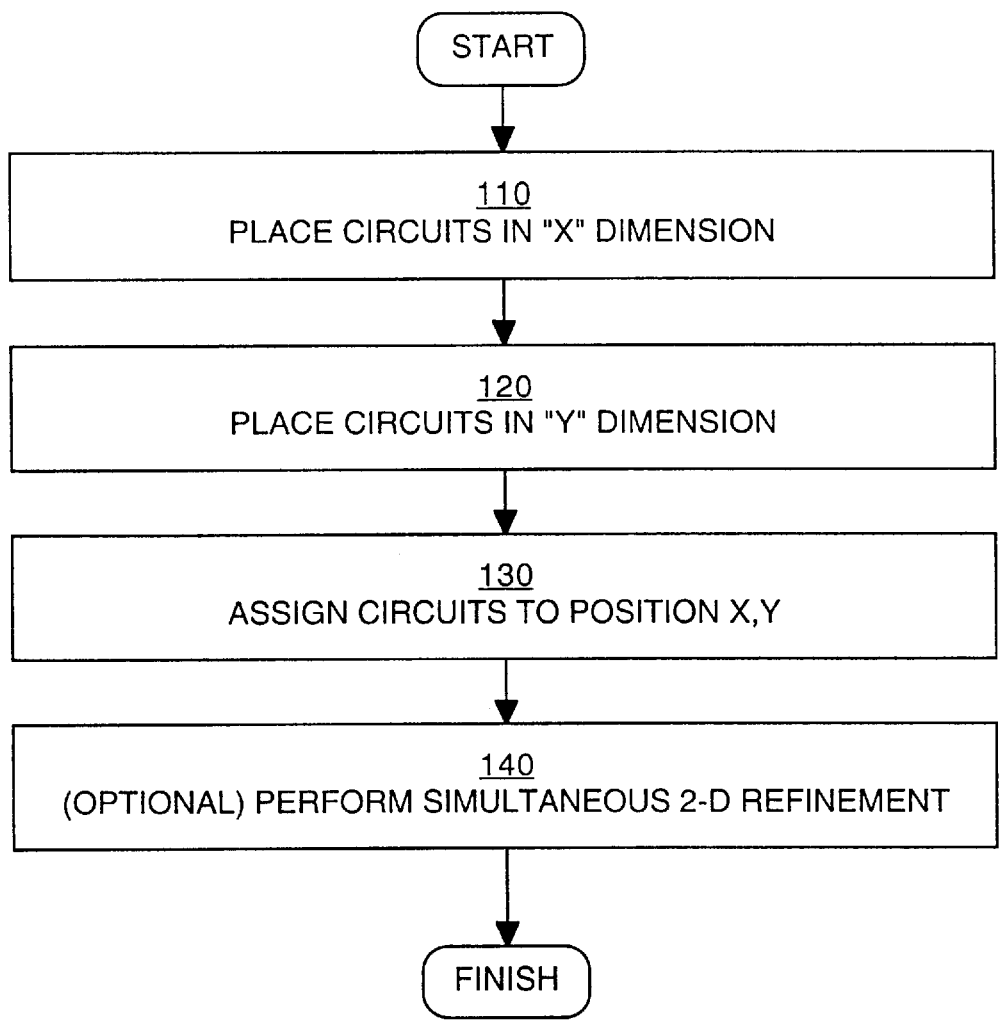
FIG. 1 is a flow diagram illustrating a method of forming a two dimensional placement of circuit elements using orthogonal one-dimensional placements, according to an embodiment of the present invention.

In the following detailed description of the present invention, quick placement of electronic circuits using orthogonal one dimensional placements, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

NOTATION AND NOMENCLATURE

Some portions of the detailed descriptions which follow (e.g., processes 100, 200 and 300) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "indexing" or "processing" or "computing" or "translating" or "calculating" or "determining" or "scrolling" or "displaying" or "recognizing" or "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

QUICK PLACEMENT OF ELECTRONIC CIRCUITS USING ORTHOGONAL ONE DIMENSIONAL PLACEMENTS

The present invention is described in the context of the field of electronic design automation (EDA). More particularly, embodiments of the present invention relate to techniques for cell placement and other optimizations used in the design and fabrication of integrated circuit devices. It is appreciated, however, that elements of the present invention may be utilized in the design and fabrication of other types of circuits, for example printed wiring boards.

The functional design of an electronic circuit specifies the cells (individual functional elements) that compose the circuit and which pins of which cells are to be connected together using wires ("nets"). "Placement" or "placing" generally refers to the important step of assigning a physical location, typically in two dimensions, in the process of physically implementing the electronic circuit, for example in an integrated circuit or on a printed wiring board.

Reference is hereby made to U.S. patent application Ser. No. 09/216,632 filed on Dec. 16, 1998, "Non-linear Optimization System and Method for Wire Length and Delay Optimization for an Automatic Electronic Circuit Placer," which is incorporated by reference in its entirety.

FIG. 1 is a flow diagram illustrating a method 100 of forming a two dimensional placement of circuit elements using orthogonal one-dimensional placements, according to an embodiment of the present invention.

In one-dimensional placement, all cells may be placed in a single long line. Hence, for example, a cell may have only a single X coordinate. The placement may be optimized for objectives such as total wire length.

In step 110, all of the cells of a design may be placed in one dimension, for example, along the "X" dimension. In this placement, the X-coordinates of fixed ports and pins may be used to determine their fixed X-positions in the one-dimensional space. It is appreciated that a different coordinate system may be chosen and that cells may be placed along either axis in arbitrary sequence, in accordance with embodiments of the present invention.

In step 120, all of the cells of a design may be placed in one dimension, for example, along the "Y" dimension. In this placement, the Y-coordinates of fixed ports and pins may be used to determine their fixed Y-positions in the one-dimensional space. It is appreciated that a different coordinate system may be chosen and that cells may be placed along either axis in arbitrary sequence, in accordance with embodiments of the present invention.

Each of the above placements may attempt to minimize total (one-dimensional) wire length. It is appreciated that other optimizations, such as for power dissipation or timing, are well suited to embodiments of the present invention. The one-dimensional size of a cell may be proportional to its two-dimensional area, and scaled by a constant factor such that all cells just fit across (or down) the chip.

In step 130, the "X" dimension from the first placement and the "Y" dimension from the second placement may be combined to from an X, Y coordinate pair which locates a cell location in two dimensions. The resulting two-dimensional placement will generally not be legal, i.e., cells may overlap with each other or violate other physical design rules. A small amount of refinement using a conventional two-dimensional placement method may be necessary to legalize the placement.

Still referring to FIG. 1, in optional step 140, a prior art, two dimensional placement may be performed to legalize and further refine the two dimensional placement produced in step 130.

The placement (excluding 2-dimensional refinement) time is proportional to $N*\log(N)*\log(N)$, where N is the number of cells. Recall that prior art two-dimensional placement time is proportional to $N (\sqrt{N}) \log(N)$.

For example, if N=100,000 cells (a relatively small design by today's standards), placement may be several hundred times faster when performed according to embodiments of the present invention. By way of further example, for N=1,000,000 cells (larger than the prior example, but not uncommon), placement may approach one thousand times faster when performed according to embodiments of the present invention.

Overall, this process yields quality of results slightly inferior to prior art two-dimensional placement, however runtime is substantially faster. Hence it has value as a rapid floor planning tool for large designs and whole chips.

The problem of placing cells in one dimension has not received much attention in the prior art since a one-dimensional placement in and of itself does not seem to be of much value. However, in light of the present invention's novel approach of combining orthogonal one-dimensional placements in order to quickly form a two dimensional placement, an efficient method of one-dimensional placement would be both useful and desirable.

Figure 2:
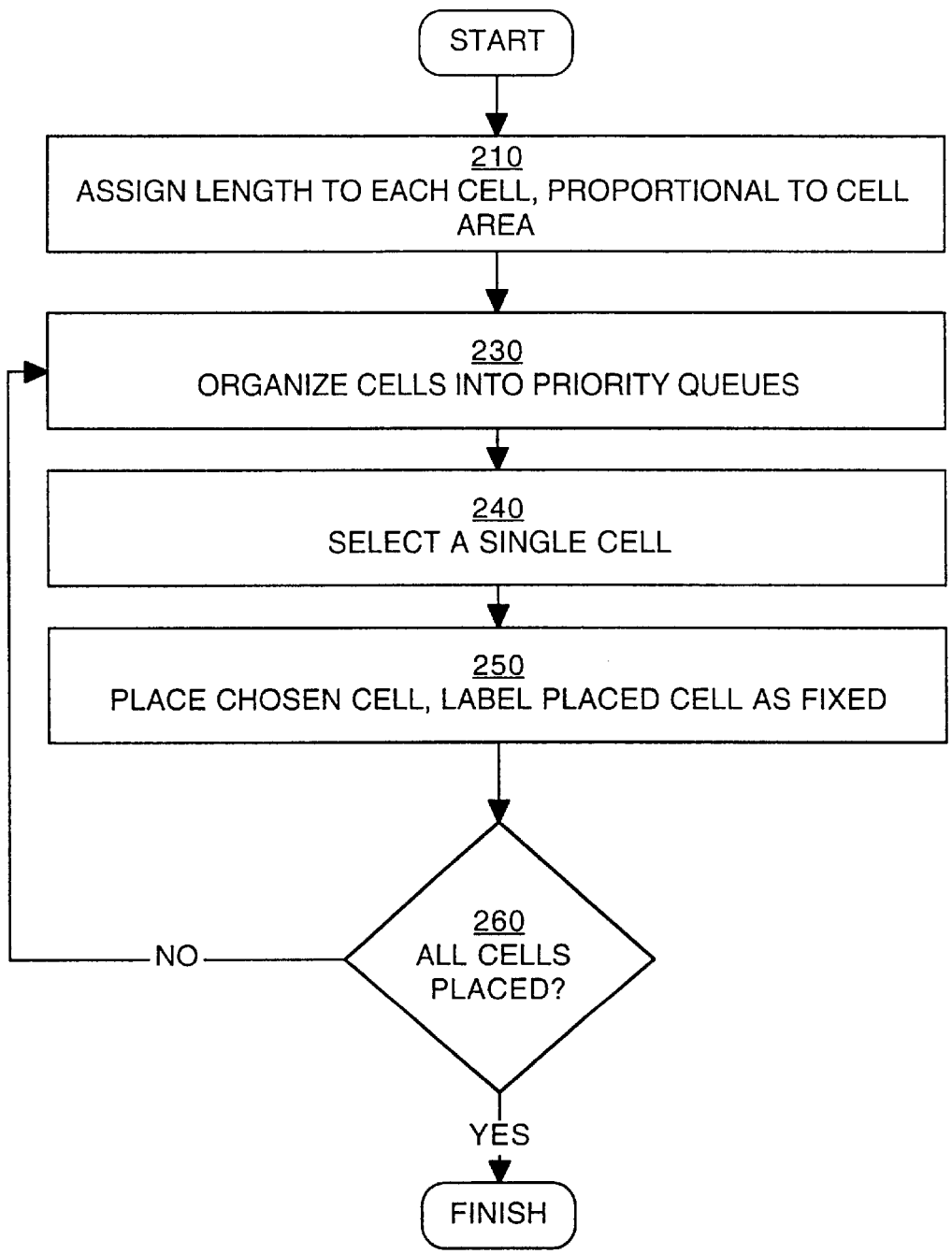
FIG. 2 is a flow diagram illustrating a method of placing electronic circuits in one dimension, according to an embodiment of the present invention.

FIG. 2 is a flow diagram illustrating a method 200 of placing electronic circuits in one dimension, according to an embodiment of the present invention.

Each cell has a two dimensional area. For the purpose of a one dimensional placement, this area must be represented in a single dimension. One could use either the length or width of the two dimensional cell for this purpose. However, experimentation has found that assigning a linear dimension, labeled "length," to each cell that is proportional to its area produces better results according to embodiments of the present invention. It is appreciated that other linear representations of area, for example the diagonal measure of the area or the square root of the area, are well suited to embodiments of the present invention.

In step 210 of FIG. 2, each cell in the circuit may be assigned a length proportional to its area. A constant scaling factor may be chosen such that the combined length of all the cells is equal to the length of the placement interval. The placement interval may be the desired length of the placement, and may be chosen to be on dimension of an integrated circuit chip.

An embodiment of the present invention may place cells one at a time, starting at the left and right ends of the interval and working inward until all cells are placed and the interval is full.

Some cells may be attached to fixed pins or ports due to their assigned function in the circuit design. Cells attached to ports are pulled in the direction of the ports, but are not fixed until they are selected from the priority queues.

Optional steps 230 through 260 represent a method of placing remaining cells along the linear interval, according to embodiments of the present invention.

In optional step 230, the remaining cells may be organized into several priority queues. A priority queue is a well known data structure.

If the fixed pin/port is in the left half of the chip, cells attached to it are considered "pulled left". If the fixed pin/port is in the right half of the chip, cells attached to it are considered "pulled right".

Each net attached to a cell pulls (left or right or neither if the net is not connected to any fixed cells) by a certain amount based on characteristics of the net. One possible formula for the pull value is:

pull(net)=w/sqrt(number_of_cells_attached(net) −1), where w is an optional user-defined weight (e.g. a timing weight). It is appreciated that other numeric representations of the concept of pull are compatible with embodiments of the present invention.

A cell may be pulled left by some nets and pulled right by others. It may also be connected to nets which are not connected to any fixed pins/ports/cells. These nets are still considered to "pull," but not in any specific direction. A data element for each cell may store two statistics:

edge pull=total right pull−total left pull unattached pull=total pull from nets which have no fixed pins/ports/cells attached.

If a cell is attached to nets which have fixed pins/ports/cells, edge pull will be defined. Cells with edge pull defined may be stored in one of two priority queues. If the edge pull is negative, the cell may be stored in the left queue. If it is positive, the cell may be stored in the right queue.

The priority in the queue is given by a formula based on the edge pull of the cell. One possible formula is as follows:

priority=abs(edge pull)/(abs(edge pull)+unattached pull)

Still referring to FIG. 2, in step 240 a single cell may be chosen for placement.

To select a cell, a random selection between the left and the right queues may be made. Next, a cell from near the start of the queue may be chosen. For example, a random cell from the highest ten priority entries may be chosen. If the chosen queue is empty, choose from the other one. If both queues are empty, an unplaced cell may be chosen at random and a side (left or right) may be chosen randomly.

The random choice elements are important to the process. It is believed that such choices help to prevent both linear placements from being too similar, which may result in a two dimensional placement in which the X and Y coordinates for each cell are very similar. Such a result would place most cells along the diagonal of the chip resulting in extremely poor utilization of chip area.

Still referring to FIG. 2, in optional step 250 the chosen cell is placed. If the cell was chosen from the left queue, the cell may be placed at the leftmost available position in the placement interval. Otherwise the cell may be placed in the rightmost available position.

Also in optional step 250, the cell just placed is labeled as fixed. In optional step 260, if cells remain to be placed, control may be transferred to option step 230.

Importantly, since the nets now have a new fixed cell, their pull direction may change, and this may affect the edge pull and unattached pull of the attached cells. In particular, the placing of a cell may cause new cells to be added to the priority queues.

Process 200 of FIG. 2 may result in a placement of all cells, known as a candidate placement. The one-dimensional wire length of this candidate placement may be further improved by moving individual cells and groups of cells left or right, changing the ordering in such a way as to improve total wire length. Similarly, cells may be flipped (left-right) to improve wire length (pins may be attached on one side of a cell and flipping will generally change the total wire length).

Figure 3:
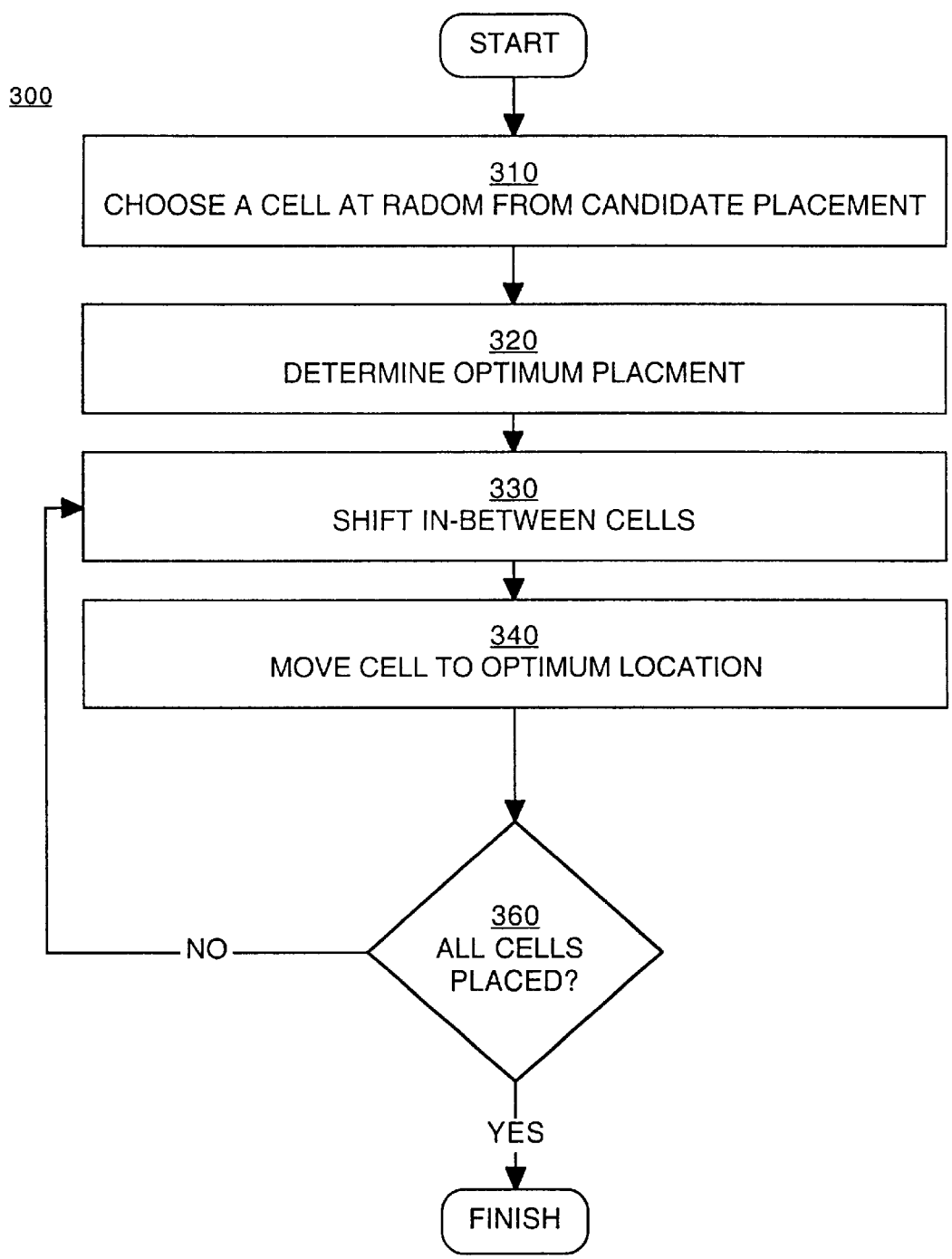
FIG. 3 is a flow diagram illustrating a method of iterative improvement in the placement of circuits placed in one dimension, according to an embodiment of the present invention.

FIG. 3 is a flow diagram illustrating a method 300 of iterative improvement in the placement of circuits placed in one dimension, according to an embodiment of the present invention.

In step 310, a cell may be chosen at random from a candidate placement.

In step 320, the optimum destination location to improve total wire length by the maximum amount for this cell may be determined. It is important that this determination be done quickly, as this step dominates the time required for processing each cell.

In order to determine the optimal destination, a tree data structure may be formed. The leaves of the tree may represent individual cells. Each leaf may represent the region that its cell occupies. Each non-leaf node of the tree may represent the (contiguous) region occupied by its subnodes.

Each node may store:
the width of the node's region.
the total number of wires crossing over the region, but not crossing over the region of the node's parent. "Crossing over" means wires that do not terminate within the region.
leaves also store partial crossings. A partial crossing is a wire which starts or ends (or both) within the leaf.

Any length of wire may be added to the data structure by accessing only (logN) order nodes. To query the number of wires crossing a point, the method may visit all nodes whose regions contain the point and sum the number of crossings. This may also be accomplished in a time proportional to (logN).

Note that the tree may be edited in order (logN) time. Edit operations are removal of a leaf node and insertion of a leaf node. When these operations are performed, values may be propagated up the tree.

The tree may then be modified so that it also stores in each node the minimum number of wires crossing any point in the node's region. These minimum values must be propagated up the tree when a change is made. The minimum value does not include wires crossing over the region of the node's parent.

These minimum values may be used to decide which point has the fewest crossings. Starting at the top of the tree, observe the left and right child. The child whose minimum crossings is smallest may be chosen. This process may be repeated until a leaf is found.

Moving a cell involves deleting the cell and all wires attached to it, shifting the cells between the initial and destination positions of the cell, and re-inserting the cell and all its wires.

To find the optimal position of the cell, the effect of each of these changes on total wire length must be accounted for.

Let x be a candidate destination position for a chosen cell. Let u be the position before moving the cell.

Deleting and re-inserting the cell changes the total wire length according to a piece wise linear function, h(x). If the cell is far to the left of any of its connections, h is decreasing with gradient −P (negative P), where P is the number of pins on the cell. Far to the right, h is increasing with gradient +P. Moving left to right, each time one of the pins that the cell is attached to is crossed, the gradient of h increases by 1.

In addition to f, there is a function g(x), representing the change to total wire length caused by shifting the in-between cells.

$$g(x)=\text{shift\_dist}(\text{num\_crossings}(v)-\text{num\_crossings}(u)).$$

This is because a gap is closed at u (saving wire) and opened at x (using extra wire).

To find the best destination position, the process must find x which minimizes $$f(x)=g(x)+h(x).$$

If h(x) were constant, g(x) would be easy to compute using the min-crossings data structure using the method described previously. Since h(x) is not constant, we must use a branch-and-bound method to compute the lowest point.

When considering whether to go left or right in our traversal down the tree, the amount by which h(x) can change over each of the child nodes must be considered. At each child node, read out the minimum crossings for that node's region and multiply it by the shift_dist. Then one must account for the uncertainty introduced by the variation of h(x) over the child node's region. This uncertainty may lead to the decision that both child nodes must be searched.

The branch and bound method may traverse more than O(logN) nodes, since it may traverse multiple branches. In the worst case, it may traverse O(N) nodes. However execution on real data indicates that it is in practice close to O(logN) nodes.

Once the optimal position for the cell has been determined, the cell is moved and the data structures are updated in O(logN) time.

Importantly, in addition moving individual cells, the iterative improvement algorithm is used to move clusters of cells.

A clustering algorithm is used to form contiguous heavily-connected clusters of cells. All the cells in the cluster are merged into one "super-cell". This is treated as a single cell by the iterative improvement method above. No other changes to the iterative improvement method are needed.

Clustering operates as follows:
1. Calculate the number of wires passing through every point in the one-dimensional placement interval. This is done in O(N) time by inserting the start and end of each wire in an array, then integrating.
2. Set current range=empty.
3. Start at the leftmost cell.
4. Add the current cell to the current range.
5. With probability P, find the best cut point in the current range. Record this as a final cut point current range= empty.
6. Move to next cell and go to step 4.

After the final cut points are determined, the contiguous runs of cells between the cut points are grouped into super-cells. Super-nets are also generated, representing the nets joining the cells.

It is appreciated that other well known methods of clustering are well suited to the present invention.

The probability P determines the typical cluster size. Several iterations are done, with cluster size gradually increasing.

It is appreciated that other data structures for representing the number of wires crossings a point, for example a skip list, are well suited to embodiments of the present invention. A skip list, which is a well-known data structure, is equivalent to a tree for the purposes of the above method, and it does not require rebalancing.

Each wire may optionally be assigned a user weight (e.g. for timing-driven placement). Instead of recording and calculating counts of wires, the sum of weights of the wires may be used.

Still referring to FIG. 3, after step 320 has determined the optimum placement for the cell (chosen in step 310), room for that cell at the optimum location is made by shifting cells between the old position of the cell and the new, optimum position for the cell.

Finally, in step 340, the cell is placed in its new, optimum position.

Step 360 is a simple branch to enable all cells to be inspected for the improvement process.

The preferred embodiment of the present invention a system and method for quick placement of electronic circuits using orthogonal one dimensional placements is thus described. While the present invention has been described in particular embodiments, it should be appreciated that the present invention should not be construed as limited by such embodiments, but rather construed according to the below claims.

What is claimed is:

1. A method for placing electronic circuits, the method comprising:
   a) placing said circuits in a first linear dimension to obtain a first placement;
   b) placing said circuits in a second linear dimension to obtain a second placement, wherein said second linear dimension is orthogonal to said first linear dimension; and
   c) assigning a two dimensional placement for said circuits by selecting for each circuit element a first coordinate from said first placement and a second coordinate from said second placement,
   wherein placing said circuits in said first linear dimension and said second linear dimension include assigning a linear length to each cell proportional to its cell area and scaled by a constant factor, wherein the sum of all said lengths is an interval, and wherein said interval is a desired length of placement.

2. The method as described in claim 1 further comprising:

d) placing said circuits simultaneously in two dimensions, wherein said two dimensional placement is an input to said placing.

3. The method as described in claim 1 wherein said first linear dimension is parallel to an edge of a semiconductor package.

4. The method as described in claim 1 wherein said second linear dimension is parallel to an edge of a semiconductor package.

5. A method of placing electronic circuits in one dimension, the method comprising:

a) assigning a linear length to each cell proportional to its cell area and scaled by a constant factor, wherein the sum of all said lengths is an interval, and wherein said interval has a beginning and an end;

b) placing fixed cells at the linear location of their fixing ports; and c) placing remaining cells in available positions along said interval.

6. The method as described in claim 5 wherein said interval is the length of one side of an integrated circuit.

7. The method as described in claim 5 wherein said c) comprises:

c1) placing remaining cells using a random choice in selecting one of said remaining cells from a plurality of said remaining cells.

8. The method as described in claim 5 further comprising:

d) dividing said interval into a first interval and a second interval.

9. The method as described in claim 8 wherein said first interval represents substantially one half of said interval.

10. A method of placing electronic circuits in one dimension, the method comprising:

a) assigning a linear length to each cell proportional to its cell area and scaled by a constant factor, wherein the sum of all said lengths is an interval, and wherein said interval has a beginning and an end;

b) placing fixed cells at the linear location of their fixing ports; and c) placing remaining cells alternately in an available positions nearest to said beginning of said interval and alternately in an available position nearest to said end of said interval.

11. A method of placing electronic circuits in one dimension, the method comprising:

a) assigning a linear length to each cell proportional to its cell area and scaled by a constant factor, wherein the sum of all said lengths is an interval, and wherein said interval has a beginning and an end;

b) placing fixed cells at the linear location of their fixing ports;

c) placing remaining cells in available positions along said interval;

d) organizing said remaining cells into a priority queue; and e) selecting one of said remaining cells from said priority queue.

12. A method of placing electronic circuits in one dimension, the method comprising:

a) assigning a linear length to each cell proportional to its cell area and scaled by a constant factor, wherein the sum of all said lengths is an interval, and wherein said interval has a beginning and an end;

b) placing fixed cells at the linear location of their fixing ports; and c) placing remaining cells in available positions along said interval, wherein said c) comprises:

c1) organizing said remaining cells into a first priority queue, a second priority queue and an unattached list;

c2) selecting one of said remaining cells from selectively said first priority queue, said second priority queue and said unattached list; and c3) placing said one of said remaining cells in an available position nearest to said beginning of said interval if said one of said remaining cells was selected from said first priority queue, placing said one of said remaining cells in an available position nearest to said end of said interval if said one of said remaining cells was selected from said second priority queue, and placing said one of said remaining cells in available position selectively in an available position nearest to said beginning of said interval and in an available position nearest to said end of said interval if both said first priority queue and said second priority queue are empty, wherein said placing results in a fixed cell.

13. The method as described in claim 12 further comprising:

d) repeating said a) through c3) until all cells are placed.

14. A method of placing electronic circuits in one dimension, the method comprising:

a) assigning a linear length to each cell proportional to its cell area and scaled by a constant factor, wherein the sum of all said lengths is an interval, and wherein said interval has a beginning and an end;

b) placing fixed cells at the linear location of their fixing ports;

c) placing remaining cells in available positions along said interval; and d) assigning a pull direction to a net attached to one of said fixed cells.

15. A method of placing electronic circuits in one dimension, the method comprising:

a) assigning a linear length to each cell proportional to its cell area and scaled by a constant factor, wherein the sum of all said lengths is an interval, and wherein said interval has a beginning and an end;

b) placing fixed cells at the linear location of their fixing ports;

c) placing remaining cells in available positions along said interval; and d) assigning a pull value to a net attached to one of said remaining cells.

16. The method as described in claim 15 wherein said pull value of said net is given by the relationship:

pull value=w/square root((number of cells attached to said net)−1), wherein said w is an optional user-defined weighting factor.

17. A method of placing electronic circuits in one dimension, the method comprising:

a) assigning a linear length to each cell proportional to its cell area and scaled by a constant factor, wherein the sum of all said lengths is an interval, and wherein said interval has a beginning and an end;

b) placing fixed cells at the linear location of their fixing ports;

c) placing remaining cells in available positions along said interval;

d) dividing said interval into a first interval and a second interval;

e) computing a pull value for a net attached to one of said remaining cells;

f) assigning a pull direction to said pull value as low pull if said net is attached to one of said fixed cells located within said first interval; and g) assigning a pull direction to said pull value as high pull if said net is attached to one of said fixed cells located within said second interval.

18. The method as described in claim 17 further comprising:

h) computing an edge pull value for a remaining cell, wherein said edge pull value is the difference between the total high pull of all nets attached to said remaining cell less the total low pull of all nets attached said remaining cell; and i) computing an unattached pull value for said remaining cell, wherein said unattached pull value is the total pull of all nets attached to said remaining cell, wherein said nets are not attached to a fixed cell.

19. A method of placing electronic circuits in one dimension, the method comprising:

a) placing cells in one dimension to produce a first placement;

b) moving cells in said first placement to improve wire length, wherein said moving produces a new placement; and c) creating a data structure for determining the number of wires crossing a point in said new placement.

20. The method as described in claim 19 further comprising using a random choice in the selection of one of a plurality of cells to move.

21. The method as described in claim 19 wherein said c) comprises: c1) creating a tree data structure.

22. The method as described in claim 19 wherein said c) comprises: c1) creating a skip list data structure.

23. The method as described in claim 19 wherein said b) comprises:

b1) choosing a cell at random from said first placement;

b2) determining the optimal destination to relocate said cell;

b3) shifting cells between the location of said cell in said first placement and said optimal destination to make room for said cell; and b4) moving said cell to said optimal destination.

24. The method as described in claim 23 further comprising:

d) repeating said b1) through b4), wherein said moving produces an improved placement, wherein said improved placement is used in place of said first placement for subsequent iterations.

25. The method as described in claim 23 wherein said b2) further comprises:

b2a) finding a value x which minimizes $f(x)=g(x)+h(x)$, wherein x is a candidate destination position for a cell, wherein $h(x)$ is a piecewise linear function describing the changes in total wire length caused by moving said cell to said position x, and $g(x)$ is a piecewise linear function describing the changes in total wire length caused by moving the cells between said cell and said position.

26. The method as described in claim 25 wherein said finding comprises a branch and bound method.

27. A method of placing electronic circuits in one dimension, the method comprising:

a) placing cells in one dimension to produce a first placement;

b) clustering cells to form a super cell; and c) moving cells in said first placement to improve wire length, wherein said moving produces a new placement, wherein said b) comprises:

b1) calculating the number of wires passing through every point in said first placement;

b2) initializing a current range value to be empty;

b3) beginning at the cell at the beginning of the placement interval;

b4) adding the number of wires passing through said cell to said current range value;

b5) finding the best cut point within a span of said current range value;

b6) recording said best cut point as a final cut point and setting the current range value to be empty; and b7) moving to the next cell and repeating said b4) through b7).

* * * * *